(12) United States Patent
Fan et al.

(10) Patent No.: US 11,315,907 B2
(45) Date of Patent: Apr. 26, 2022

(54) FULL-COLOR DISPLAY MODULE AND DISPLAY DEVICE

(71) Applicant: FOSHAN NATIONSTAR OPTOELECTRONICS CO., LTD, Guangdong (CN)

(72) Inventors: Kailiang Fan, Guangdong (CN); Kuai Qin, Guangdong (CN); Heng Guo, Guangdong (CN); Qiang Zhao, Guangdong (CN); Zongxian Xie, Guangdong (CN); Chungan Jiang, Guangdong (CN)

(73) Assignee: FOSHAN NATIONSTAR OPTOELECTRONICS CO., LTD, Guangdong (CN)

( * ) Notice: Subject to any disclaimer, the term of this patent is extended or adjusted under 35 U.S.C. 154(b) by 119 days.

(21) Appl. No.: 16/995,850

(22) Filed: Aug. 18, 2020

(65) Prior Publication Data

US 2021/0193629 A1 Jun. 24, 2021

(30) Foreign Application Priority Data

Dec. 23, 2019 (CN) .......................... 201911340841.6

(51) Int. Cl.
*H01L 25/075* (2006.01)
*G09G 3/32* (2016.01)

(52) U.S. Cl.
CPC .............. *H01L 25/075* (2013.01); *G09G 3/32* (2013.01); *G09G 2300/0452* (2013.01)

(58) Field of Classification Search
CPC .............. G09G 3/32; G09G 2300/0452; H01L 25/167; H01L 25/0756; H01L 33/48; H01L 25/075

See application file for complete search history.

(56) References Cited

U.S. PATENT DOCUMENTS

| 2009/0002287 | A1* | 1/2009 | Kitazawa | H01L 27/3244 345/82 |
| 2018/0366534 | A1* | 12/2018 | Tomioka | H01L 51/0097 |
| 2020/0041085 | A1* | 2/2020 | Miyairi | F21S 41/153 |

* cited by examiner

*Primary Examiner* — Muhammad N Edun
(74) *Attorney, Agent, or Firm* — Yu Gang

(57) ABSTRACT

Some embodiments provide a full-color display module and display device. The full-color display module includes at least two light-emitting layers. Any one of the at least two light-emitting layers includes a substrate and a plurality of light-emitting portions encapsulated on the substrate. A type of any one of the plurality of light-emitting portions is one of a red light-emitting portion, a green light-emitting portion, and a blue light-emitting portion. The at least two light-emitting layers are successively laminated in a laminating direction and form a plurality of pixel points. Any one of the plurality of pixel points is a surrounding area on the full-color display module, which is surrounded by a surrounding curved surface. The surrounding area of the any one of the plurality of pixel points includes at least one red light-emitting portion, at least one green light-emitting portion, and at least one blue light-emitting portion.

20 Claims, 3 Drawing Sheets

FULL-COLOR DISPLAY MODULE AND DISPLAY DEVICE

CROSS-REFERENCE TO RELATED APPLICATIONS

The present disclosure claims priority to Chinese Patent Application No. 201911340841.6, filed on Dec. 23, 2019 and entitled "Full-Color Display Module and Display Device", the contents of which are hereby incorporated by reference in its entirety.

TECHNICAL FIELD

The present disclosure relates to a field of display devices, and more particularly, to a full-color display device and display device.

BACKGROUND

A Micro Light Emitting Diode (LED) display technology generally refers to a technology that uses LED light-emitting units with a size of 1 μm to 60 μm to form a display array, and has characteristics of no backlight, high photoelectric conversion efficiency, large brightness, high contrast, fast response time, and the like.

However, in today's severe trend of pursuing colorization, high resolution and high contrast, Micro-LED full colorization is a technical means that is relatively easy to achieve high resolution and high contrast of products under a technology known to inventors.

The basic principle of achieving Micro-LED full-color display through technical means is to achieve full-color display through mixing of three primary colors. A common implementation is to encapsulate a light-emitting device capable of emitting light of three primary colors on a substrate, and each pixel point corresponds to at least three light-emitting devices emitting light of three primary colors. The light of three primary colors is generated by the light-emitting device itself, or is generated by exciting a corresponding material by the light-emitting device.

At present, a main technical difficulty is that a size of Micro-LED is extremely small. In high-resolution panels or modules, a number of three-primary-color Micro-LED chips is large, a transfer is difficult, a transfer cost is high, a maintenance is difficult, and a yield of finished products is low. The above defects hinder a popularization and application of Micro-LED.

SUMMARY

Some embodiments of the present disclosure provide a full-color display module and display device. By separately providing a plurality of light-emitting portions in a pixel point on more than two layers of substrates, a number of chips on a single substrate, a chip installation density and a difficulty of circuit wiring are greatly reduced. The full-color display module has advantages of low transfer difficulty, high yield rate, easy maintenance, and the like.

Some embodiments of the present disclosure provide a full-color display module, which includes at least two light-emitting layers. Any one of the at least two light-emitting layers includes a substrate and a plurality of light-emitting portions encapsulated on the substrate. A type of any one of the plurality of light-emitting portions is one of a red light-emitting portion, a green light-emitting portion, and a blue light-emitting portion.

The at least two light-emitting layers are successively laminated in a laminating direction and, form a plurality of pixel points, any one of the plurality of pixel points is a surrounding area on the full-color display module, which is surrounded by a surrounding curved surface, the surrounding curved surface is formed by a movement of a generatrix in a same direction as the laminating direction around a closed contour curve, and a plane of the closed contour curve is perpendicular to the laminating direction.

The surrounding area of the any one of the plurality of pixel points includes at least one red light-emitting portion, at least one green light-emitting portion, and at least one blue light-emitting portion.

In some embodiments, a substrate in the lowermost light-emitting layer in the at least two light-emitting layers has a transparent or non-transparent structure at a position corresponding to the plurality of pixel points, and a substrate in a remaining light-emitting layer in the at least two light-emitting layers has a transparent structure at a position corresponding to the plurality of pixel points.

In some embodiments, a light transmittance of the substrate at a position of the transparent structure is greater than or equal to 80%.

In some embodiments, the full-color display module further includes a carrier board. A substrate in the lowermost light-emitting layer among the at least two light-emitting layers is disposed on the carrier board.

In some embodiments, the at least two light-emitting layers are successively laminated in the laminating direction by a light-curing glue or a heat-curing glue.

In some embodiments, a light transmittance of the light-curing glue or the heat-curing glue is greater than or equal to 95%.

In some embodiments, a plurality of light-emitting portions in the any one of the plurality of pixel points are misaligned with each other in the laminating direction.

In an optional implementation, the number of the light-emitting layers may be two, and the two light-emitting layers include a red light-emitting layer and a blue-green light-emitting layer, respectively.

Types of the light-emitting portions in the red light-emitting layer are all red light-emitting portions, and types of the light-emitting portions in the blue-green light-emitting layer include a green light-emitting portion and a blue light-emitting portion.

In some embodiments, a number of the light-emitting layers is two, and a light-emitting portion in a top light-emitting layer is opposite to a light-emitting portion in a bottom light-emitting layer of two light-emitting layers.

In some embodiments, a number of the light-emitting layers is three, and three light-emitting layers include a red light-emitting layer, a blue light-emitting layer, and a green light-emitting layer, respectively.

Types of light-emitting portions in the red light-emitting layer are all red light-emitting portions, types of light-emitting portions in the blue light-emitting layer are all blue light-emitting portions, and types of light-emitting portions in the green light-emitting layer are all green light-emitting portions.

In some embodiments, any one of the at least two light-emitting layers further includes a flat cable drawn from one side of the substrate in the any one of the at least two light-emitting layers, and the flat cable is electrically connected with the plurality of light-emitting portion on a corresponding light-emitting layer.

When the at least two light-emitting layers are successively laminated, orientations of flat cables of the at least two light-emitting layers are different from each other; or orientations of flat cables of the at least two the light-emitting layers are the same, and lengths of flat cables of the at least light-emitting layers are different from each other; or orientations of flat cables of the at least two light-emitting layers are the same, and the flat cables of the at least two light-emitting layers are misaligned in the laminating direction.

In some embodiments, a reference plane is formed perpendicular to the laminating direction.

Projections of a plurality of light-emitting portions on any one of the plurality of pixel points onto the reference plane are uniformly disposed in a circumferential direction with respect to a central point; or projections of a plurality of light-emitting portions on any one of the plurality of pixel points onto the reference plane are arranged along a straight line.

In some embodiments, a thickness of any one of the at least two light-emitting layers is H, H≤650 μm.

In some embodiments, the plurality of light-emitting portions of the any one of the at least two light-emitting layers are encapsulated on a corresponding substrate by an encapsulating colloid.

A light transmittance of the encapsulating colloid is greater than or equal to 95%.

In some embodiments, a reference plane is formed perpendicular to the laminating direction, the plurality of pixel points are disposed in an array along a first array direction and a second array direction in projections of the plurality of pixel points onto the reference plane, and the plurality of light-emitting portions in each of the plurality of pixel points are disposed at a same position in a corresponding pixel point.

In the projections of the plurality of pixel points onto the reference plane, a distance between light-emitting portions located at a same position on two adjacent pixel points in the plurality of pixel points is a pixel pitch in the first array direction or the second array direction, and a distance between any light-emitting portion on any one of the plurality of pixel points and any light-emitting portion on a pixel point adjacent to the any one of the plurality of pixel points is greater than ½ of the pixel pitch.

In some embodiments, each of the plurality of the light-emitting portions is formed by a Micro-LED chip of a corresponding light-emitting color, or each of the plurality of light-emitting portions is formed by a quantum dot material of a corresponding color excited by blue-light Micro-LED chip or an ultraviolet Micro-LED chip.

Some embodiments of the present disclosure further provide a full-color display device, which includes the above full-color display module. In the full-color display module and equipment provided by some embodiments of the present disclosure, the full-color display module is provided with a plurality of light-emitting layers, a plurality of three-primary-color light-emitting portions in a pixel point, of a display module are respectively disposed in different light-emitting layers, a number of light-emitting chips on one substrate can be significantly reduced, a difficulty of transferring light-emitting chips can be reduced, and a yield rate of the full-color display module can be improved. The plurality of light-emitting layers can be independently tested before laminating into a full-color display module. A light-emitting layer that fails the test can be replaced before assembling into the full-color display module, which reduces a maintenance cost and has good economy.

BRIEF DESCRIPTION OF THE DRAWINGS

In order to more clearly illustrate the technical solutions in the embodiments of the present disclosure or the technology known to inventors, the drawings used in the description of the embodiments or the art known to inventors will be briefly described below. It is apparent that the drawings in the following description are only some embodiments of the present disclosure, and other drawings can be obtained from those skilled in the art according to these drawings without any creative work.

DETAILED DESCRIPTION OF THE EMBODIMENTS

The technical solutions in the embodiments of the present disclosure will be clearly and completely described below with reference to the drawings in the embodiments of the present disclosure. It is apparent that the described embodiments are only a part of the embodiments of the present disclosure, not all of the embodiments. On the basis of the embodiments of the present disclosure, all other embodiments obtained on the premise of no creative work of those of ordinary skill in the art fall within the scope of protection of the present disclosure.

Embodiment 1

Figure 1:
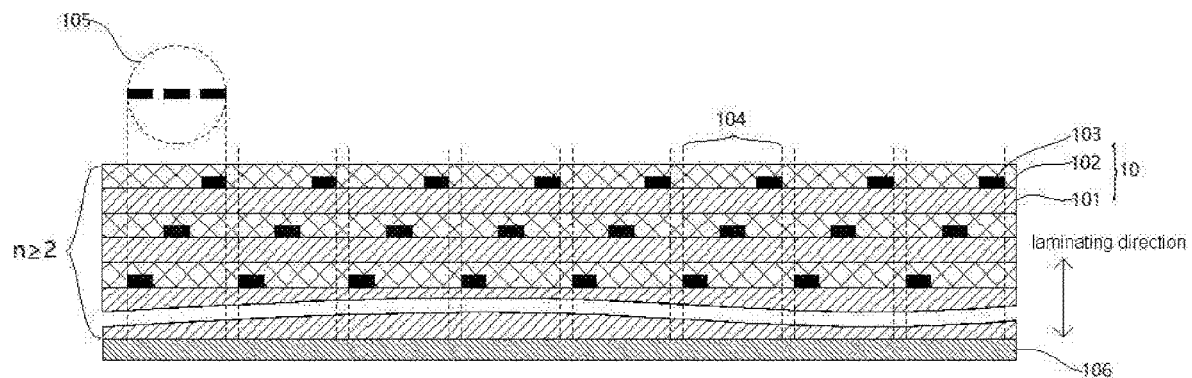
FIG. 1 illustrates a three-dimensional schematic structure diagram of a full-color display module according to Embodiment 1 of the present disclosure.

FIG. 1 illustrates a three-dimensional schematic structure diagram of a full-color display module according to an embodiment of the present disclosure.

An embodiment of the present disclosure provides a full-color display module, which includes at least two light-emitting layers 10. In the embodiment of the present disclosure, a number of light-emitting layers is represented by n, n≥2.

Any one of the at least two light-emitting layers 10 includes a substrate 101 and a plurality of light-emitting portions 103 encapsulated on the substrate. In some embodiment, the plurality of light-emitting portions 103 are encapsulated by an encapsulating colloid. An encapsulating colloid material for encapsulating the plurality of light-emitting portions 103 forms an encapsulation layer 102 with a flat top surface, so as to facilitate a lamination of the at least two light-emitting layers 10.

In some embodiments, the light-emitting portion 103 is formed by a Micro-LED chip of a corresponding light-emitting color, or the light-emitting portion 103 is formed by a quantum dot material of a corresponding color excited by a blue Micro-LED chip or an ultraviolet Micro-LED chip.

The quantum dot material is disposed on a surface of the blue Micro-LED chip or the ultraviolet Micro-LED chip in a corresponding covering manner. In some embodiments, if types of light-emitting portions in a light-emitting layer are the same, the quantum dot material is mixed to an encapsulant colloid to save process steps.

In some embodiments, it is considered that if a thickness of a light-emitting layer is too large, a contrast of the plurality of pixel points will be reduced, which easily affects a display effect. Therefore, a thickness of any one of the plurality of light-emitting layers is H, H≤650 μm.

In some embodiments, a thickness of the substrate is less than or equal to 500 μm, and correspondingly, a thickness of the encapsulation layer is less than or equal to 150 μm. In specific implementation, in order to ensure the encapsulation effect of the encapsulation layer on the light-emitting portion, the thickness of the encapsulation layer is at least required to be 20 μm higher than the height of the light-emitting portion. In some embodiments, the thickness of the encapsulation layer is 20 μm to 50 μm higher than the height of the light-emitting portion.

In some embodiments, in order to further ensure a display effect of the full-color display module, a light transmittance of a encapsulating colloid (that is, the encapsulation layer after the molding of the encapsulating colloid) is greater than or equal to 95%, and a light transmittance of the substrate is greater than or equal to 80%.

In some embodiments, the full-color display module of the Embodiment 1 is used to achieve full-color display of pixels. Therefore, a type of any one of the plurality of light-emitting portions 103 is a red light-emitting portion that emits red light, a green light-emitting portion that emits green light, or a blue light-emitting portion. In some embodiments, a specific arrangement of the red light-emitting portion, the green light-emitting portion, and the blue light-emitting portion will be described in the following embodiments in conjunction with the actual implementation.

In some embodiments, the at least two light-emitting layers 10 are successively laminated in a laminating direction shown in the figure to form a complete full-color display module. In some embodiments, the at least two light-emitting layers 10 are successively laminated by a light-curing glue or a heat-curing glue.

An advantage of laminating the at least two light-emitting layer 10 based on light-curing glue (such as UV glue) is that after the light-emitting layer 10 is laminated, glue can be cured by light irradiation, and there is no need to move a position of parts, which can prevent the light-emitting layer from moving after laminating (before the glue is not cured), and reduce a possibility of misalignment between different light-emitting layers. An advantage of laminating each light-emitting layer 10 based on light-curing glue (such as UV glue) is that a glue cost is lower.

Similarly, in order to further ensure the display effect of the full-color display module, a light transmittance of the light-curing glue or the heat-curing glue is greater than or equal to 95%. Further, the light transmittance of the light-curing glue or the heat-curing glue is greater than or equal to 98%.

For a whole full-color display module, the at least two light-emitting layers 10 are successively laminated and form a plurality of pixel points 104, any one of the plurality of pixel points 104 is a surrounding area on the full-color display module, which is surrounded by a surrounding curved surface (FIG. 1 is a front view, and a contour line of the surrounding curved surface overlaps with two curves corresponding to a reference 104), the surrounding curved surface is formed by a movement of a generatrix in a same direction as the laminating direction around a closed contour curve, and a plane of the closed contour curve is perpendicular to the laminating direction.

In some embodiments, a surrounding area of the any one of the plurality of pixel points 104 includes at least one red light-emitting portion, at least one green light-emitting portion, and at least one blue light-emitting portion.

It should be noted that a pixel point area (marked with a dotted line) marked in drawings is only used to show a minimum area range of a pixel point. In specific implementation, in a full-color display module, two adjacent pixel points is considered to be bonded to each other. A specific pixel point area also is considered to include a partial area outside the light-emitting portion (can be understood in conjunction with FIG. 5 and FIG. 6 in the drawings).

It should be noted that, in some embodiments, a plurality of light-emitting portions 103 in the any one of the plurality of pixel points 104 are misaligned with each other in the laminating direction of the at least two light-emitting layers 10, so as to prevent a light-emitting portion 103 located upper from blocking vertical direction (illustrated manner) light emitted by the light-emitting portion 103 located thereunder.

In some embodiments, the full-color display module provided by the present embodiment is mainly used to display specific colored pixel points on a front of the full-color display module. The pixel points on a same full-color display module or the pixel points on a plurality of consecutive full-color display modules are combined to form a full-color pattern. In the embodiment of the present disclosure, a light-emitting portion 103 is disposed on the corresponding substrate 101, and light from the light-emitting portion 103 is emitted upward. Light emitted from the light-emitting portion 103 on the lower light-emitting layer 10 passes through upper light-emitting layers 10 in sequence and then is emitted from the front of the full-color display module. In theory, light emitted by the light-emitting portions 103 on different light-emitting layers 10 is different in the time when light reaches a front of the full-color display module (the thickness of the light-emitting layer is extremely small, and the time when light emitted by the light-emitting portion of the light-emitting layer reaches the front of the full-color display module can be negligible), and the full-color display module of Embodiment 1 and the full-color display module with all the light-emitting portions disposed on a same substrate have a same light-emitting effect.

Referring to FIG. 1 in the drawings, an enlarged top view 105 of a pixel point is shown. A viewing angle of the enlarged top view 105 is consistent with a viewing angle of the front of the full-color display module. As can be seen from the enlarged top view 105, just in terms of the viewing angle, the full-color display module of embodiments and the full-color display module in which all light-emitting portions are disposed on a same substrate have the same visual effects.

In some embodiments, there are many types of composition structures of the light-emitting portion. The light-emitting portion is directly composed of LED chips with three primary colors, which can be Micro-LED chips in some embodiments. The size of the LED chip is less than or equal to 50 um. In addition, the light-emitting portion can also excite color conversion materials through blue LED chips or violet LED chips to emit three primary colors of light.

In some embodiments, except for the substrate 101 of a bottom light-emitting layer 10, the substrates 101 of remaining light-emitting layers 10 of the at least two light-emitting layers 10 have a transparent structure at a position corresponding to the plurality of pixel points 104 to prevent the substrates 101 from blocking light from the light-emitting portion 103 located thereunder. In some embodiments, a light transmittance of a substrate at a position of the transparent structure is greater than or equal to 80%.

In some embodiments, the full-color display module further includes a carrier board 106, the substrate 101 in the lowermost light-emitting layer 10 in the at least two light-emitting layers 10 is disposed on the carrier board 106, and the carrier board is mainly used for providing support for the at least two light-emitting layers 10. By providing a structure of the carrier board 106, the light-emitting layer 10 itself does not need to consider a problem of support strength too much, which is beneficial to a light-emitting layer 10 to be thinner and lighter. In addition, in order to prevent light from exiting from a back of the full-color display module, a substrate of the bottom light-emitting layer 10 is designed with a non-transparent structure, or a substrate of the bottom light-emitting layer 10 is designed with a transparent structure, and then a bottom of the substrate of the light-emitting layer 10 is coated with a non-transparent material to achieve shading.

In some embodiments, the full-color display module provided by the present embodiment is provided with a plurality of light-emitting layers, a plurality of three-primary-color light-emitting portions in a pixel point of a display module are respectively disposed in different light-emitting layers, a number of light-emitting chips on one substrate can be significantly reduced, a difficulty of transferring light-emitting chips can be reduced, and a yield rate of the full-color display module can be improved. The light-emitting layers can be independently tested before laminating into the full-color display module. The light-emitting layer that fails the test can be replaced before assembling into the full-color display module, which reduces a maintenance cost and has good economy.

Embodiment 2

Figure 2:
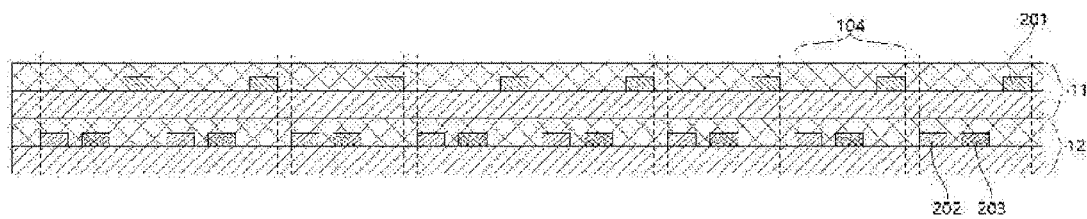
FIG. 2 illustrates a schematic structure diagram of a full-color display module according to Embodiment 2 of the present disclosure.

FIG. 2 illustrates a schematic structure diagram of a full-color display module according to an embodiment of the present disclosure.

In some embodiments, a number of light-emitting layers of the full-color display module of the embodiment of the present disclosure is n=2. Two light-emitting layers are a red light-emitting layer 11 and a blue-green light-emitting layer 12, respectively.

Light-emitting portions in the red light-emitting layer 11 are all red light-emitting portions 201, and types of the light-emitting portions in the blue-green light-emitting layer 12 include a green light-emitting portion 202 and a blue light-emitting portion 203.

In some embodiments, within an area of a pixel point 104, there are a red light-emitting portion 201, a green light-emitting portion 202, and a blue light-emitting portion 203. In the specific implementation, an arrangement position of the red light-emitting portion 201 on the red light-emitting layer 11, an arrangement position of the green light-emitting portion 202 on the blue-green light-emitting layer 12, and an arrangement position of the blue light-emitting portion 203 on the blue-green light-emitting layer 12 should correspond to each other to ensure that each pixel 104 can achieve full-color display.

In some embodiments, a projection structure of the red light-emitting portion 201, the green light-emitting portion 202, and the blue light-emitting portion 203 in a pixel point in the laminating direction (that is, a mutual positional relationship between the red light-emitting portion 201, the green light-emitting portion 202, and the blue light-emitting portion 203 in a same pixel point) will be described in the subsequent embodiments.

It should be noted that the reason why the red light-emitting layer 11 is disposed on a top layer of the at least two light-emitting layers is that when the red light-emitting portion 201 is added as a red LED chip, the red LED chip has a low light-emitting efficiency, so in order to ensure a color balance, the red light-emitting layer 11 is disposed on the top layer.

Embodiment 3

Figure 3:
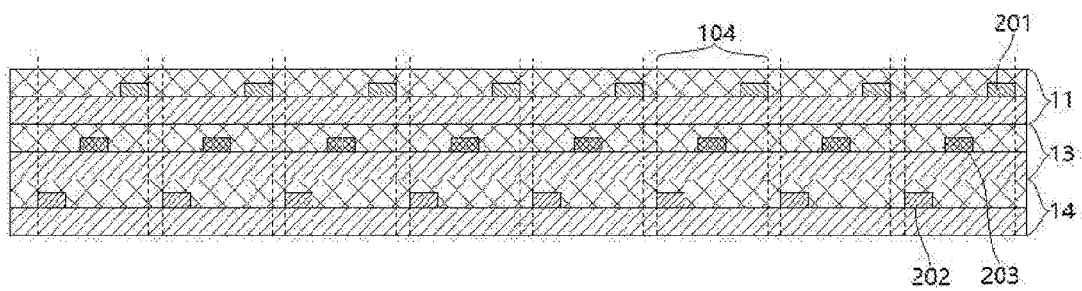
FIG. 3 illustrates a schematic structure diagram of a full-color display module according to Embodiment 3 of the present disclosure.

FIG. 3 illustrates a schematic structure diagram of a full-color display module according to an embodiment of the present disclosure.

In some embodiments, a number of light-emitting layers of the full-color display module of the embodiment of the present disclosure is n=3. The three light-emitting layers are a red light-emitting layer 11, a blue light-emitting layer 13, and a green light-emitting layer 14, respectively. The light-emitting portions in the red light-emitting layer 11 are all red light-emitting portions 201, the light-emitting portions in the blue light-emitting layer 13 all blue light-emitting portions 203, and the light-emitting portions in the green light-emitting layer 14 are all green light-emitting portions 202.

In some embodiments, since the light-emitting efficiency of the blue LED chip and the green LED chip is similar, the arrangement positions of the blue light-emitting layer 13 and the green light-emitting layer 14 are interchangeable.

In addition, the light-emitting portions on each light-emitting layer are designed in a same color, which is beneficial to a layout of a circuit, simplifies a wiring difficulty, and has good practicality.

Embodiment 4

In the full-color display modules provided in Embodiments 1 to 3, the arrangement directions of the light-emitting portions on different light-emitting layers relative to the corresponding substrate are the same, that is, in the at least two light-emitting layers, the light-emitting portions are all disposed on a top surface of a corresponding substrate.

In some embodiments, arrangement directions of light-emitting portions on different light-emitting layers relative to the corresponding substrate are different.

With the full-color display module provided in Embodiment 2, on the basis of the full-color display module provided in Embodiment 2, the top light-emitting layer is disposed upside down.

Figure 4:
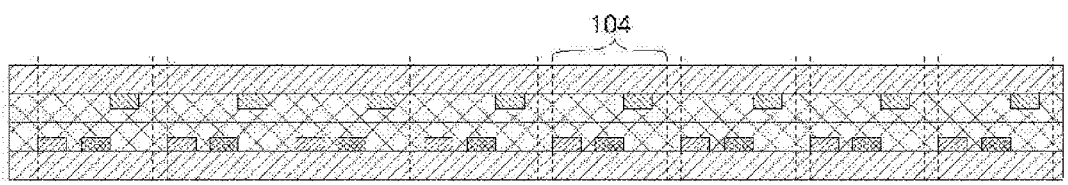
FIG. 4 illustrates a schematic structure diagram of a full-color display module according to Embodiment 4 of the present disclosure.

FIG. 4 in the drawings illustrates a schematic structure diagram of a full-color display module according to an embodiment of the present disclosure. A top light-emitting layer is disposed upside down, and the light-emitting portion on the top light-emitting layer is opposite to the light-emitting portion on a bottom light-emitting layer.

In some embodiments, setting of the light-emitting colors of the light-emitting portion of the top light-emitting layer and the light-emitting portion of the bottom light-emitting layer is not limited. For example, the light-emitting portion on the bottom light-emitting layer includes a blue light-emitting portion and a green light-emitting portion, the light-emitting portion on the top light-emitting layer is a red light-emitting portion, or the light-emitting portion on the bottom light-emitting layer includes a blue light-emitting portion and a red light-emitting portion, the top light-emitting portion is a green light-emitting portion.

In some embodiments, with this arrangement, a distance between the light-emitting portions on different light-emitting layers in a same pixel point 104 in the laminating direction can be reduced, and the light-emitting effect and the synchronization of light emitted by the light-emitting portions can be improved.

In some embodiments, a reflective layer is disposed on the substrate of the bottom light-emitting layer to further reflect light of the top light-emitting layer and improve a utilization rate of light. In some embodiments, the substrate of the bottom light-emitting layer is a non-transparent material. In some embodiments, the bottom light-emitting layer is placed on the carrier board, and the carrier board is non-transparent.

In some embodiments, by reducing a thickness of the encapsulation layer, in a same pixel 104, the distance between light-emitting portions on different light-emitting layers in the laminating direction is shortened, and materials or routes through which light of the light-emitting portions of different light-emitting layers pass are similar. A consistency of light is improved. In some embodiments, the light-emitting portions on two light-emitting layers are encapsulated at a same time by one encapsulation layer, so that the light-emitting portions on the two light-emitting layers are on a same plane or overlap horizontally in a direction shown in the figure. Therefore, a purpose of improving a light-emitting effect and a light-emitting synchronization of the light-emitting portion is achieved.

Embodiment 5

Figure 5:
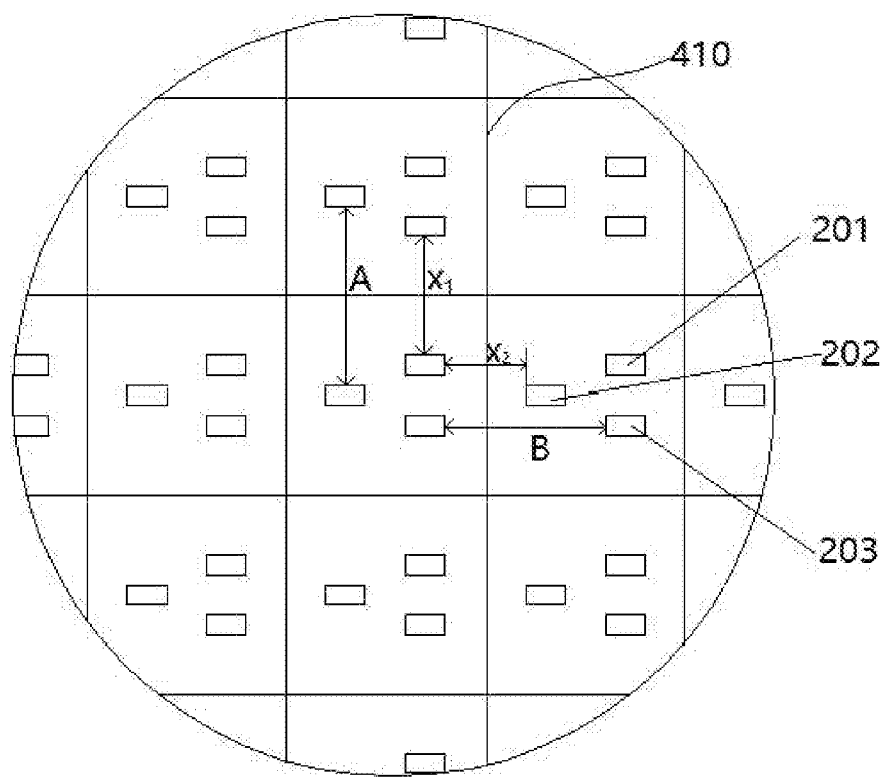
FIG. 5 illustrates a top-view schematic structure diagram of a full-color display module according to Embodiment 5 of the present disclosure.

FIG. 5 illustrates a top-view schematic structure diagram of a full-color display module according to an embodiment of the present disclosure.

Embodiment 5 of the present disclosure provides a full-color display module. Referring to the top view schematically shown in FIG. 5 in the drawings, the full-color display module includes a plurality of pixel points 410 (block areas). A plurality of light-emitting portions (red light-emitting portion 201, green light-emitting portion 202, and blue light-emitting portion 203) on any one of the plurality of pixel points 410 are not arranged on a straight line.

In some embodiments, the plurality of light-emitting portions in each pixel point 410 are evenly distributed along a circumferential direction with a center of the corresponding pixel point 410 as a center of a circle.

In some embodiments, in order to ensure a resolution of a pixel point, it is necessary to design an installation position of a light-emitting portion on the pixel point. In specific implementation, a reference plane is formed perpendicular to the laminating direction, the plurality of pixel points 410 are arranged in an array along a first array direction (vertical direction of FIG. 5 in the drawings) and a second array direction (horizontal direction of FIG. 5 in the drawings) in projections of the plurality of pixel points 410 onto the reference plane, that is, in a viewing angle direction (viewing angle of FIG. 5 in the drawings) on the laminating direction, and the plurality of light-emitting portions in each of the plurality of pixel points 410 are disposed at a same position in the pixel point.

In order to ensure an accurate identification of the pixel points 410, to avoid that a light-emitting portion in a pixel point 410 and a light-emitting portion on an adjacent pixel point 410 form a new pixel point by mistake, and reduce the resolution of the pixel point 410, in specific implementation, in the projections of the plurality of pixel points 410 onto the reference plane, a distance between the light-emitting portions located at the same position on two adjacent pixel points 410 is a pixel pitch in the first array direction or the second array direction, and a distance between any light-emitting portion on any one of the plurality of pixel points 410 and any light-emitting portion on a pixel point 410 adjacent to the any one of the plurality of pixel points is greater than ½ of the pixel pitch.

As in a first array direction of FIG. 5 in the drawings (vertical direction of FIG. 5 in the drawings), a pixel pitch is A, a distance $x_1$ between two light-emitting portions with a smallest separation distance in the adjacent pixel point 410 is greater than A/2, and a distance between any light-emitting portion on any one of the plurality of pixel points and any light-emitting portion on the pixel point adjacent to the any one of the plurality of pixel points is greater than A/2.

As in a second array direction of FIG. 5 in the drawings (horizontal direction of FIG. 5 in the drawings), a pixel pitch is B, a distance $x_2$ between two light-emitting portions with a smallest separation distance in the adjacent pixel point 410 is greater than B/2, and a distance between any one of the light-emitting portion on any one of the pixel points and any light-emitting portion on the pixel point adjacent to the any one of the plurality of pixel points is greater than B/2.

Embodiment 6

Figure 6:
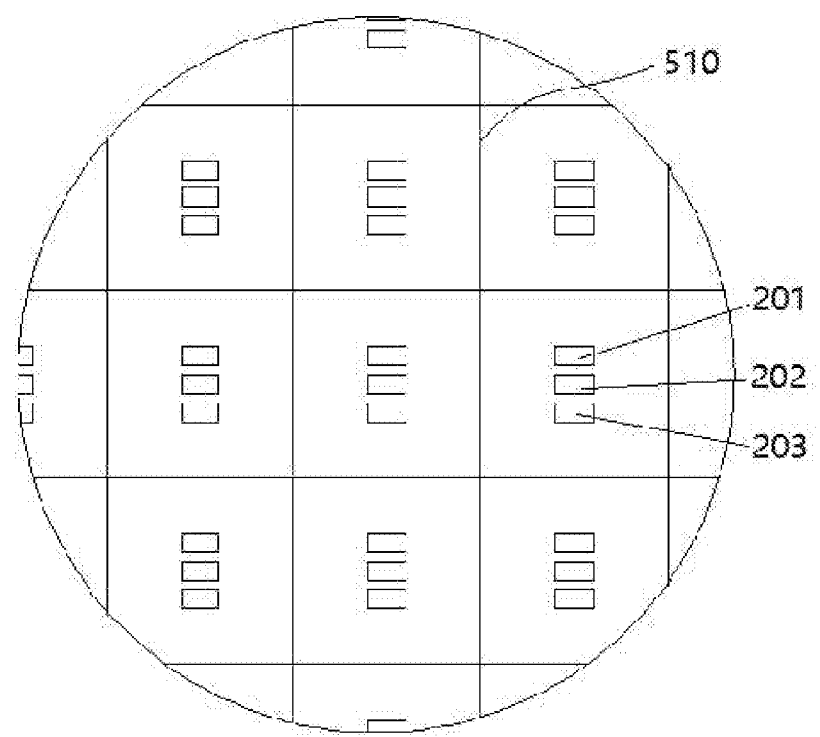
FIG. 6 illustrates a top-view schematic structure diagram of a full-color display module according to Embodiment 6 of the present disclosure.

FIG. 6 illustrates a top-view schematic structure diagram of a full-color display module according to an embodiment of the present disclosure.

The embodiment of the present disclosure provides a full-color display module. Referring to a top view schematically shown in FIG. 6 in the drawings, the full-color display module includes a plurality of pixel points 510 (block areas). A plurality of light-emitting portions (red light-emitting portion 201, green light-emitting portion 202, and blue light-emitting portion 203) on any one of the plurality of pixel points 510 are arranged on a straight line.

Embodiment 7

In some embodiments, any one of the at least two light-emitting layers further includes a flat cable drawn from one side of the substrate in the any one of the at least two light-emitting layers, and the flat cable is electrically connected with the plurality of light-emitting portions on the corresponding light-emitting layer. The flat cable is used for connecting with an external connector, so that an external device can control the light-emitting portions on each of the plurality of light-emitting layers.

In some embodiments, a circuit material on the substrate adopts transparent conductive ink (transmittance >90%) or transparent ITO (indium tin oxides, transmittance >80%), a circuit on the substrate is processed by printing (the line width accuracy can be 80 microns), ink jet (the line width accuracy can be 40 microns) or photolithography process (the line width accuracy can be 1 micron) and the like, and then a flat cable electrically connected with the substrate circuit is drawn on one side of the substrate. In some embodiments, since the flat cable is mainly used to be connected with the external connector, it is necessary to design the arrangement mode of the flat cable in order to avoid position interference of the flat cable between different light-emitting layers and to facilitate a connection between the flat cable and the external connector.

In some embodiments, when the at least two light-emitting layers are successively laminated, orientations of the flat cables of the at least two light-emitting layers are different; or orientations of the flat cables of the at least two light-emitting layers are the same, and lengths of the flat cables of the at least two light-emitting layers are different from each other; or orientations of the flat cables of the at least two light-emitting layers are the same, and the flat cables of the at least two light-emitting layers are misaligned in the laminating direction of the at least two light-emitting layers.

Figure 7:
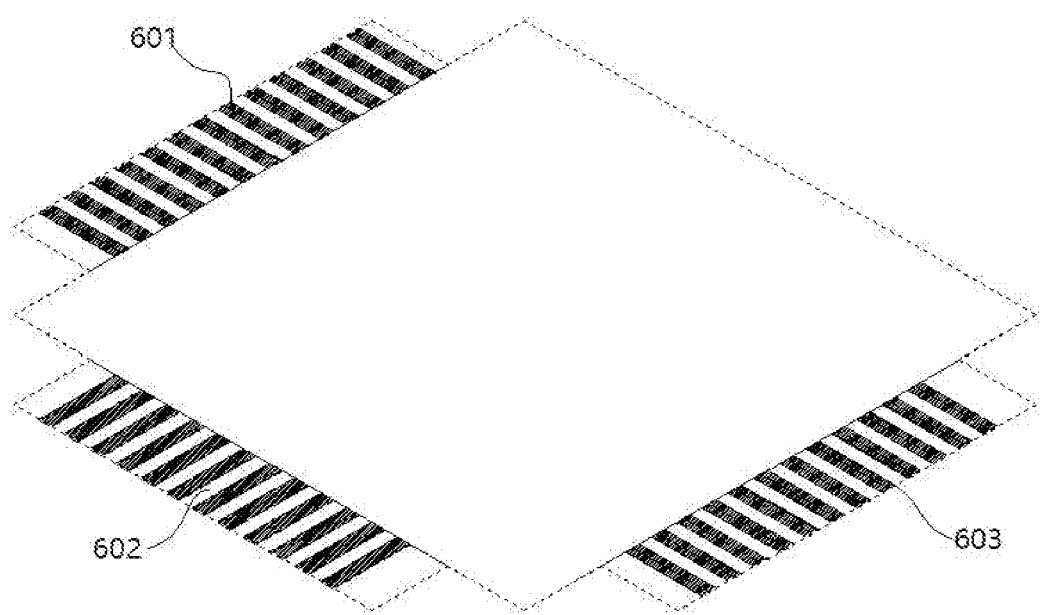
FIG. 7 illustrates a three-dimensional schematic structure diagram of a full-color display module according to Embodiment 7 of the present disclosure.

FIG. 7 illustrates a three-dimensional schematic structure diagram of a full-color display module according to an embodiment of the present disclosure.

In some embodiments, the embodiment of the present disclosure describes a flat cable structure of the full-color display module of the embodiment of the present disclosure by the full-color display module of Embodiment 3. Correspondingly, the flat cable drawn from the red light-emitting layer 11 is a red flat cable 601, the flat cable drawn from the blue light-emitting layer 13 is a blue flat cable 602, and the flat cable drawn from the green light-emitting layer 14 is a green flat cable 603. When light-emitting layers are laminated, the red flat cable 601, the blue flat cable 602 and the green flat cable 603 are respectively oriented in different directions, and when connected to the external connector, the connection between different flat cables does not interfere with each other.

In addition, in some embodiments, when the light-emitting layers are laminated, the flat cables of the red flat cable 601, the blue flat cable 602, and the green flat cable 603 are oriented to a same side. In this implementation, in order to avoid mutual interference between the flat cables, in some embodiments, lengths of the red flat cable 601, the blue flat cable 602, and the green flat cable 603 are different from each other. In some embodiments, lengths of the flat cables increase from the bottom to the top along the laminating direction, a length of the flat cable corresponding to the bottom light-emitting layer is the shortest, and a length of the flat cable corresponding to the top light-emitting layer is the longest. In the present embodiment, the green flat cable 603 is the shortest, the blue flat cable 602 is the second shortest, and the red flat cable 601 is the longest. When connecting with the external connector, wiring is started gradually from the bottom flat cable to prevent interference between the flat cables of different light-emitting layers.

In addition, in some embodiments, when a width of the flat cable is adaptively reduced and a length of one side of the light-emitting layer is greater than or equal to three times the width of the flat cable, when the light-emitting layers are laminated, the orientations of the flat cables of the at least two light-emitting layers are the same, and in the laminating direction, the flat cables of all the light-emitting layers are misaligned with each other in the laminating direction, thereby avoiding interference when connecting with the external connector.

Correspondingly, some embodiments of the present disclosure further provide a full-color display device, which includes the full-color display module described in any one of the above embodiments.

To sum up, some embodiments of the present disclosure provides a full-color display module and display device. In the full-color display module, by separately arranging a plurality of light-emitting portions in a pixel point on at least two layers of substrates, the number of chips on a single substrate, the chip installation density and the difficulty of circuit wiring are greatly reduced. The full-color display module has the advantages of low transfer difficulty, high yield rate, easy maintenance, and the like.

The above is a detailed description of a full-color display module and display device provided by the embodiments of the present disclosure. The principle and implementation manner of the present disclosure are described in the specific examples herein. The description of the embodiments is only for helping to understand the method of the present disclosure and its core ideas. Furthermore, for those of ordinary skill in the art, according to the idea of the present disclosure, there will be changes in specific implementation manners and application scopes. In conclusion, the above description should not be taken as limiting the present disclosure.

What is claimed is:

1. A full-color display module, comprising at least two light-emitting layers, wherein any one of the at least two light-emitting layers comprises a substrate and a plurality of light-emitting portions encapsulated on the substrate, and a type of any one of the plurality of light-emitting portions is one of a red light-emitting portion, a green light-emitting portion, and a blue light-emitting portion;
   the at least two light-emitting layers are successively laminated in a laminating direction and form a plurality of pixel points, any one of the plurality of pixel points is a surrounding area on the full-color display module, which is surrounded by a surrounding curved surface, the surrounding curved surface is formed by a movement of a generatrix in a same direction as the laminating direction around a closed contour curve, and a plane of the closed contour curve is perpendicular to the laminating direction; and
   the surrounding area of the any one of the plurality of pixel points comprises at least one red light-emitting portion, at least one green light-emitting portion, and at least one blue light-emitting portion.

2. The full-color display module according to claim 1, wherein a substrate in the lowermost light-emitting layer in the at least two light-emitting layers has a transparent or non-transparent structure at a position corresponding to the plurality of pixel points, and a substrate in a remaining light-emitting layer in the at least two light-emitting layers has a transparent structure at a position corresponding to the plurality of pixel points.

3. The full-color display module according to claim 2, wherein a light transmittance of the substrate at a position of the transparent structure is greater than or equal to 80%.

4. The full-color display module according to claim 1, further comprising a carrier board, wherein a substrate in the lowermost light-emitting layer of the at least two light-emitting layers is disposed on the carrier board.

5. The full-color display module according to claim 1, wherein the at least two light-emitting layers are successively laminated in the laminating direction by a light-curing glue or a heat-curing glue.

6. The full-color display module according to claim 5, wherein a light transmittance of the light-curing glue or the heat-curing glue is greater than or equal to 95%.

7. The full-color display module according to claim 1, wherein a plurality of light-emitting portions in the any one of the plurality of pixel points are misaligned with each other in the laminating direction.

8. The full-color display module according to claim 1, wherein a number of the light-emitting layers is two, and two light-emitting layers comprises a red light-emitting layer and a blue-green light-emitting layer, respectively; and types of the light-emitting portions in the red light-emitting layer are all red light-emitting portions, and types of the light-emitting portions in the blue-green light-emitting layer comprise a green light-emitting portion and a blue light-emitting portion.

9. The full-color display module according to claim 1, wherein a number of the light-emitting layers is two, a light-emitting portion in a top light-emitting layer of two light-emitting layers is opposite to a light-emitting portion in a bottom light-emitting layer of two light-emitting layers.

10. The full-color display module according to claim 1, wherein a number of the light-emitting layers is three, and three light-emitting layers comprises a red light-emitting layer, a blue light-emitting layer, and a green light-emitting layer, respectively; and types of light-emitting portions in the red light-emitting layer are all red light-emitting portions, types of light-emitting portions in the blue light-emitting layer are all blue light-emitting portions, and types of light-emitting portions in the green light-emitting layer are all green light-emitting portions.

11. The full-color display module according to claim 1, wherein any one of the at least two light-emitting layers further comprises a flat cable drawn from one side of the substrate in the any one of the at least two light-emitting layers, and the flat cable is electrically connected with the plurality of light-emitting portions on a corresponding light-emitting layer; and when the at least two light-emitting layers are successively laminated, orientations of flat cables of the at least two light-emitting layers are different from each other; or orientations of flat cables of the at least two light-emitting layers are the same, and lengths of flat cables of the at least two light-emitting layers are different from each other; or orientations of flat cables of the at least two light-emitting layers are the same, and the flat cables of the at least two light-emitting layers are misaligned in the laminating direction.

12. The full-color display module according to claim 1, wherein a reference plane is formed perpendicular to the laminating direction; and projections of a plurality of light-emitting portions on any one of the plurality of pixel points onto the reference plane are uniformly disposed in a circumferential direction with respect to a central point; or projections of a plurality of light-emitting portions on any one of the plurality of pixel points onto the reference plane are arranged along a straight line.

13. The full-color display module according to claim 1, wherein a thickness of any one of the at least two light-emitting layers is H, H≤650 μm.

14. The full-color display module according to claim 1, wherein the plurality of light-emitting portions of the any one of the at least two light-emitting layers are encapsulated on a corresponding substrate by an encapsulating colloid; and a light transmittance of the encapsulating colloid is greater than or equal to 95%.

15. The full-color display module according to claim 1, wherein a reference plane is formed perpendicular to the laminating direction, the plurality of pixel points are disposed in an array along a first array direction and a second array direction in projections of the plurality of pixel points onto the reference plane, and the plurality of light-emitting portions in each of the plurality of pixel points are disposed at a same position in a corresponding pixel point; and in the projections of the plurality of pixel points onto the reference plane, a distance between light-emitting portions located at a same position on two adjacent pixel points in the plurality of pixel points is a pixel pitch in the first array direction or the second array direction, and a distance between any light-emitting portion on any one of the plurality of pixel points and any light-emitting portion on a pixel point adjacent to the any one of the plurality of pixel points is greater than ½ of the pixel pitch.

16. The full-color display module according to claim 1, wherein each of the plurality of light-emitting portions is formed by a Micro-LED chip of a corresponding light-emitting color, or each of the plurality of light-emitting portions is formed by a quantum dot material of a corresponding color excited by a blue-light Micro-LED chip or an ultraviolet Micro-LED chip.

17. A full-color display device, comprising the full-color display module according to claim 1.

18. The full-color display device according to claim 17, wherein a substrate in the lowermost light-emitting layer in the at least two light-emitting layers has a transparent or non-transparent structure at a position corresponding to the plurality of pixel points, and a substrate in a remaining light-emitting layer in the at least two light-emitting layers has a transparent structure at a position corresponding to the plurality of pixel points.

19. The full-color display device according to claim 18, wherein a light transmittance of the substrate at a position of the transparent structure is greater than or equal to 80%.

20. The full-color display device according to claim 17, wherein the full-color display module further comprises a carrier board, wherein a substrate in the lowermost light-emitting layer of the at least two light-emitting layers is disposed on the carrier board.

\* \* \* \* \*